(12) United States Patent
Loeper et al.

(10) Patent No.: US 12,233,566 B2
(45) Date of Patent: *Feb. 25, 2025

(54) PERSONAL CARE APPLIANCE

(71) Applicant: The Gillette Company LLC, Boston, MA (US)

(72) Inventors: Jannik Loeper, Hattersheim (DE); Jan Christian Langsdorf, Oberursel (DE); Martin Stratmann, Bad Soden (DE)

(73) Assignee: The Gillette Company LLC, Boston, MA (US)

( * ) Notice: Subject to any disclaimer, the term of this patent is extended or adjusted under 35 U.S.C. 154(b) by 726 days.

This patent is subject to a terminal disclaimer.

(21) Appl. No.: 17/224,686

(22) Filed: Apr. 7, 2021

(65) Prior Publication Data

US 2022/0324126 A1    Oct. 13, 2022

(51) Int. Cl.
*B26B 21/40* (2006.01)
*B26B 19/38* (2006.01)
*H05K 1/14* (2006.01)

(52) U.S. Cl.
CPC ........ *B26B 21/405* (2013.01); *B26B 19/3873* (2013.01); *H05K 1/148* (2013.01); *H05K 2201/10098* (2013.01)

(58) Field of Classification Search
CPC .............. B26B 21/405; B26B 21/4056; B26B 19/3873; H05K 1/148
See application file for complete search history.

(56) References Cited

U.S. PATENT DOCUMENTS

| | | | | | |
|---|---|---|---|---|---|
| 4,890,329 | A | * | 12/1989 | Erbe | H05K 1/189 381/322 |
| 4,912,769 | A | * | 3/1990 | Erbe | H05K 1/189 381/322 |
| 5,032,737 | A | * | 7/1991 | Holm | H05K 1/148 29/850 |
| 6,665,191 | B2 | * | 12/2003 | Blood | H05K 1/189 174/254 |
| 8,081,788 | B2 | * | 12/2011 | Koo | H05K 1/0218 381/189 |

(Continued)

FOREIGN PATENT DOCUMENTS

EP    3077773 A1    10/2016

OTHER PUBLICATIONS

15966Q PCT Search Report and Written Opinion for PCT/US2022/071530 dated Sep. 1, 2022, 12 pages.

*Primary Examiner* — Jason Daniel Prone
(74) *Attorney, Agent, or Firm* — John M. Lipchitz

(57) ABSTRACT

A personal care appliance with a flexible circuit board having a first end portion, a second end portion and a flexible bridge between the first end portion and the second end portion. A first rigid circuit board is mounted to the first end portion of the flexible circuit board. A second rigid circuit board is mounted to the second end portion of the flexible circuit board and folded over the first rigid circuit board. At least one electronic component that emits electromagnetic waves is mounted to the first rigid circuit board. A flexible antenna is in electrical communication with first rigid circuit board. The flexible antenna has a top surface with a copper track facing away from the first rigid circuit board in a folded position.

8 Claims, 10 Drawing Sheets

(56) References Cited

U.S. PATENT DOCUMENTS

| | | | | |
|---|---|---|---|---|
| 8,305,772 B2* | 11/2012 | Chew | ............... | H05K 1/0218 |
| | | | | 361/818 |
| 8,634,204 B2* | 1/2014 | Rothkopf | ............... | H05K 1/189 |
| | | | | 174/254 |
| 9,126,346 B2* | 9/2015 | Meier | ............... | B26B 21/4056 |
| 9,519,319 B2* | 12/2016 | Dean | ............... | H05K 1/147 |
| 9,633,977 B1* | 4/2017 | We | ............... | H05K 1/185 |
| 9,912,087 B2* | 3/2018 | Broemse | ............... | B26B 21/48 |
| 9,913,386 B2* | 3/2018 | Behrendt | ............... | B26B 21/48 |
| 9,950,436 B2* | 4/2018 | Broemse | ............... | B26B 21/405 |
| 10,099,393 B2* | 10/2018 | Gester | ............... | B26B 21/48 |
| 10,383,267 B2* | 8/2019 | Behrendt | ............... | B26B 21/405 |
| 10,431,915 B2* | 10/2019 | Broemse | ............... | B26B 21/405 |
| 10,449,681 B2 | 10/2019 | Binder | | |
| 10,583,576 B2* | 3/2020 | Broemse | ............... | B26B 21/405 |
| 10,717,201 B2* | 7/2020 | Fuerst | ............... | B26B 19/3873 |
| 10,894,330 B2* | 1/2021 | Goeder | ............... | B26B 21/4056 |
| 11,247,356 B2* | 2/2022 | Broemse | ............... | B26B 21/405 |
| 11,357,109 B2* | 6/2022 | An | ............... | H05K 1/148 |
| 11,389,980 B1* | 7/2022 | VonDahlen | ............... | B26B 21/4056 |
| 11,389,982 B2* | 7/2022 | Beerwerth | ............... | B26B 21/4056 |
| 2008/0155831 A1* | 7/2008 | Royle | ............... | B26B 21/405 |
| | | | | 30/34.2 |
| 2016/0057546 A1* | 2/2016 | Lyon | ............... | H05K 1/147 |
| | | | | 381/312 |
| 2016/0167241 A1 | 6/2016 | Goldfarb et al. | | |
| 2016/0375596 A1* | 12/2016 | Broemse | ............... | B26B 21/405 |
| | | | | 29/843 |
| 2017/0179103 A1* | 6/2017 | Aleksov | ............... | H05K 1/148 |
| 2018/0027344 A1* | 1/2018 | Dzarnoski, Jr. | ............... | H05K 1/189 |
| | | | | 381/324 |
| 2018/0109881 A1* | 4/2018 | Chew | ............... | H04R 25/402 |
| 2019/0166693 A1 | 5/2019 | Gebhardt et al. | | |
| 2021/0043588 A1 | 2/2021 | Wang et al. | | |
| 2022/0001559 A1* | 1/2022 | Hiller | ............... | B26B 21/4056 |
| 2022/0126470 A1* | 4/2022 | Broemse | ............... | B26B 21/405 |
| 2022/0324127 A1 | 10/2022 | Loeper et al. | | |
| 2023/0171911 A1* | 6/2023 | Maggi | ............... | H05K 1/148 |
| | | | | 361/752 |

\* cited by examiner

PERSONAL CARE APPLIANCE

FIELD OF THE INVENTION

The present invention relates to electronic personal care appliances having electronic subassemblies and more particularly to shaving razors having electronic subassemblies.

BACKGROUND OF THE INVENTION

Personal care appliances are becoming more advanced and thus often require the incorporation of electronic components to deliver new and/or improved consumer benefits. Electronic components are subject to failure when exposed to a wet environment, such as the bathroom. Electronic components must also be small to fit within a personal care appliance, such as a razor or a toothbrush. Accordingly, electronic components and fittings must be efficiently assembled within a small space without breaking. More personal care devices are incorporating connectivity to smart devices, for example via BlueTooth® or WiFi and thus require an antenna that must fit within a small interior space. Electronic components within the personal care device may create electromagnetic waves that interfere with the antenna. The antenna must be able to send and receive signals to devices outside of the personal care device, while various electronic components must be shielded from sending out interfering electromagnetic waves. The shielding and prevention of interference can increase complexity and size constraints for personal care appliances. In order to provide a safe and functional personal care appliance, the electronic components must be efficiently assembled in a reliable cost effective manner within required size constraints.

Accordingly, there is a need to efficiently assemble electronic components of a personal care appliance in a simple and reliable manner. Furthermore, there is a need to efficiently minimize stray electromagnetic waves from interfering with one or more antennae which may be incorporated into personal care appliances.

SUMMARY OF THE INVENTION

The invention features, in general, a personal care appliance with a flexible circuit board having a first end portion, a second end portion and a flexible bridge between the first end portion and the second end portion. A first rigid circuit board is mounted to the first end portion of the flexible circuit board. A second rigid circuit board is mounted to the second end portion of the flexible circuit board and folded over the first rigid circuit board. At least one electronic component that emits electromagnetic waves is mounted to the first rigid circuit board. A flexible antenna is in electrical communication with first rigid circuit board. The flexible antenna has a top surface with a copper track facing away from the first rigid circuit board in a folded position.

The invention also features, in general, a method of assembling a personal care appliance by providing a flexible bridge between a first rigid circuit board and a second rigid circuit board. At least one electronic component emitting electromagnetic waves is mounted to the first rigid circuit board or the second rigid circuit board. The first rigid circuit board is folded over the second rigid circuit board. A flexible antenna is in electrical communication with first rigid circuit board. A copper track on a top surface of the flexible antenna faces away from the first rigid circuit board.

The invention also features, in general a personal care appliance with a flexible circuit board having a first end portion, a second end portion and a flexible bridge between the first end portion and the second end portion. A first rigid circuit board is mounted to the first end portion of the flexible circuit board. A second rigid circuit board is mounted to the second end portion of the flexible circuit board and folded over the first rigid circuit board. At least one electronic component that emits electromagnetic waves is mounted to the first rigid circuit board. A flexible shield is folded over the at least one electronic component.

The invention also features, in general an electronic subassembly for a personal care appliance with a flexible circuit board having a first end portion, a second end portion and a flexible bridge between the first end portion and the second end portion. A first rigid circuit board is mounted to the first end portion of the flexible circuit board. A second rigid circuit board is mounted to the second end portion of the flexible circuit board and folded over the first rigid circuit board. At least one electronic component that emits electromagnetic waves is mounted to the first rigid circuit board. A flexible shield is folded over the at least one electronic component. A flexible antenna is in electrical communication with first rigid circuit board. The flexible antenna is folded under the a first rigid circuit board in a folded position.

The invention also features, in general a method of assembling a personal care appliance by providing a flexible bridge between a first rigid circuit and a second rigid circuit board. At least one electronic component emitting electromagnetic waves is mounted to the first rigid circuit board or the second rigid circuit board. A flexible shield is provided that extends out from first rigid circuit board or the second rigid circuit board. The flexible shield is folded over the at least one electronic component. The second rigid circuit board is folded over the first rigid circuit board by bending the flexible bridge.

The details of one or more embodiments of the invention are set forth in the accompanying drawings and the description below. It is understood that certain embodiments may combine elements or components of the invention, which are disclosed in general, but not expressly exemplified or claimed in combination, unless otherwise stated herein. Other features and advantages of the invention will be apparent from the description and drawings, and from the claims.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings.

DETAILED DESCRIPTION OF THE INVENTION

Figure 1:
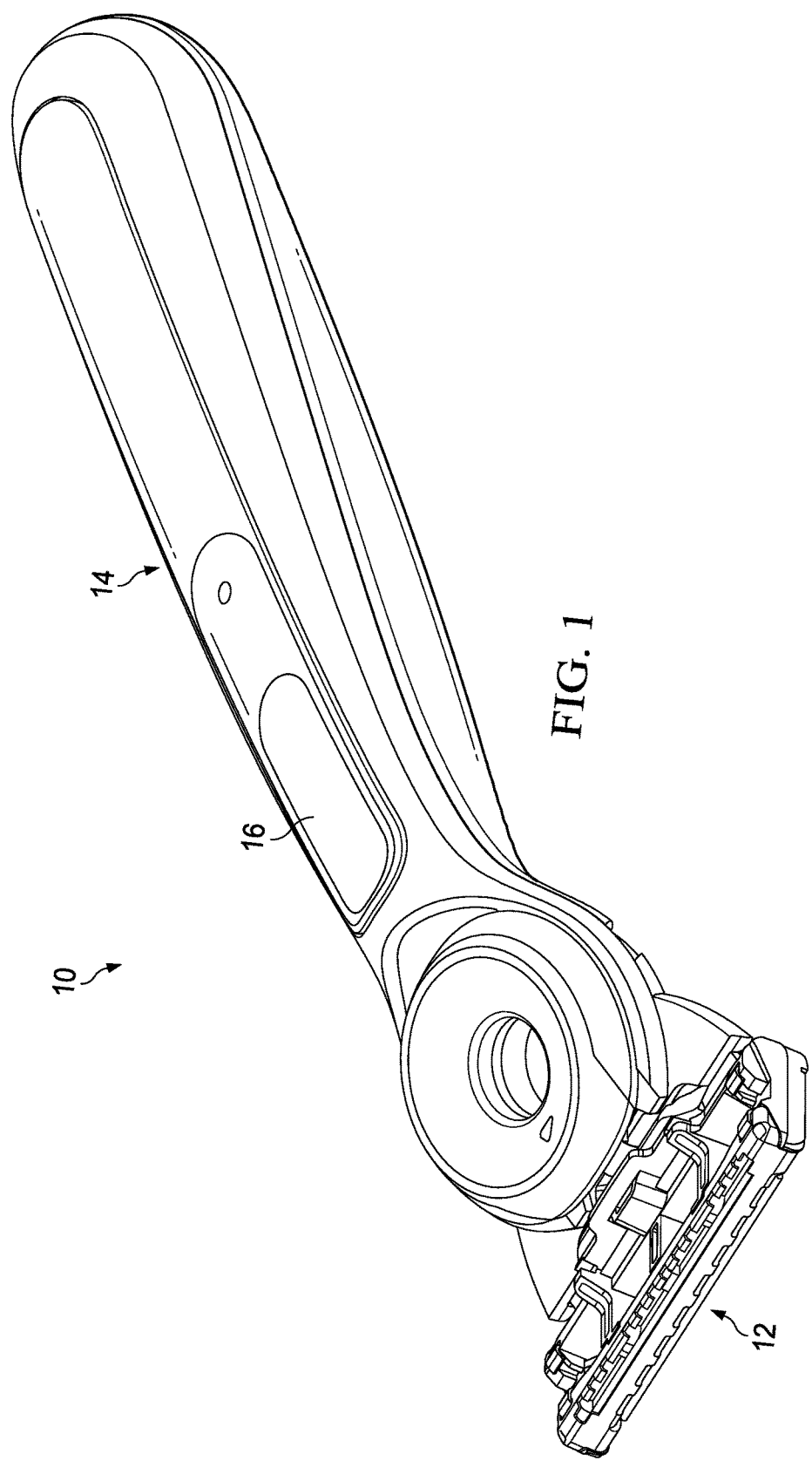
FIG. 1 is a perspective view of one possible embodiment of a personal care appliance.

Referring to FIG. 1, one possible embodiment of the present disclosure is shown illustrating a personal care appliance 10. Although the personal care appliance 10 shown is a wet shaving razor system, it is understood that other personal care appliances may include, but are not limited to a foil type shaving razor, a toothbrush, a shaving brush, a powered cleansing apparatus, an epilator, and other powered personal appliances. These appliances may be used in a wet environment, such as the bathroom. In certain embodiments, the personal care appliance 10 may include a cartridge 12 (e.g., a shaving razor cartridge) that may be removably mounted to a handle 14. The handle 14 may include a consumer usable interface 16, such as a touch screen. In certain embodiments, the consumer may digitally connect the personal care appliance with a smart device, such as a smart phone or smart watch.

Figure 2:
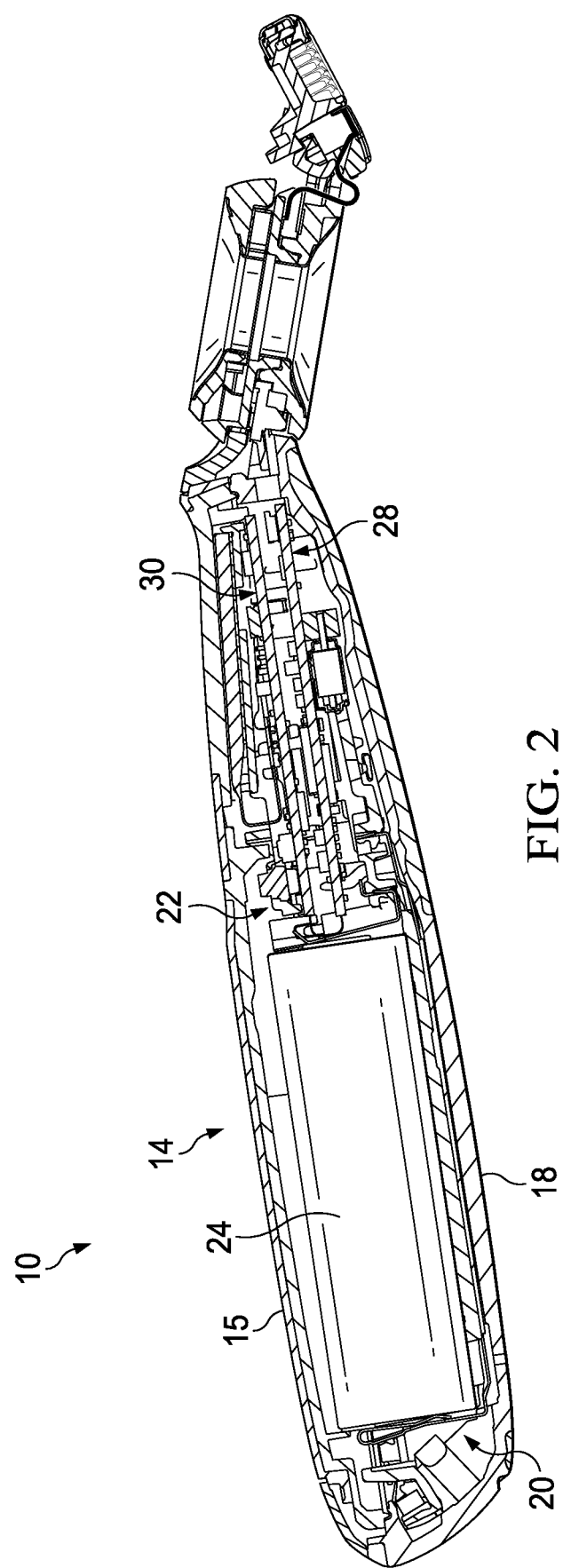
FIG. 2 is a cross section view of the personal care appliance, taken generally along the line 2-2 of FIG. 1.

Referring to FIG. 2, a cross section view of the personal care appliance 10 is illustrated, taken generally along the line 2-2 of FIG. 1. The handle 14 may include a housing 18 defining a cavity 20 dimensioned to receive an electronic subassembly 22 that is electrically connected to a power source 24, such as a rechargeable battery. A cover 15 may be secured to the housing 18 to protect the components positioned within the cavity 20, such as the power source 24 and the electronic subassembly. As will be described in further detail below, the electronic subassembly 22 may include a platform 26 that supports a first rigid circuit board 28. A second rigid circuit board 30 may be positioned over the first rigid circuit board 28. The first rigid circuit board 28 and the second rigid circuit board 30 may be spaced apart such that any electronic components of the first rigid circuit board 28 and the second rigid circuit board 30 are not damaged during assembly.

Figure 3A:
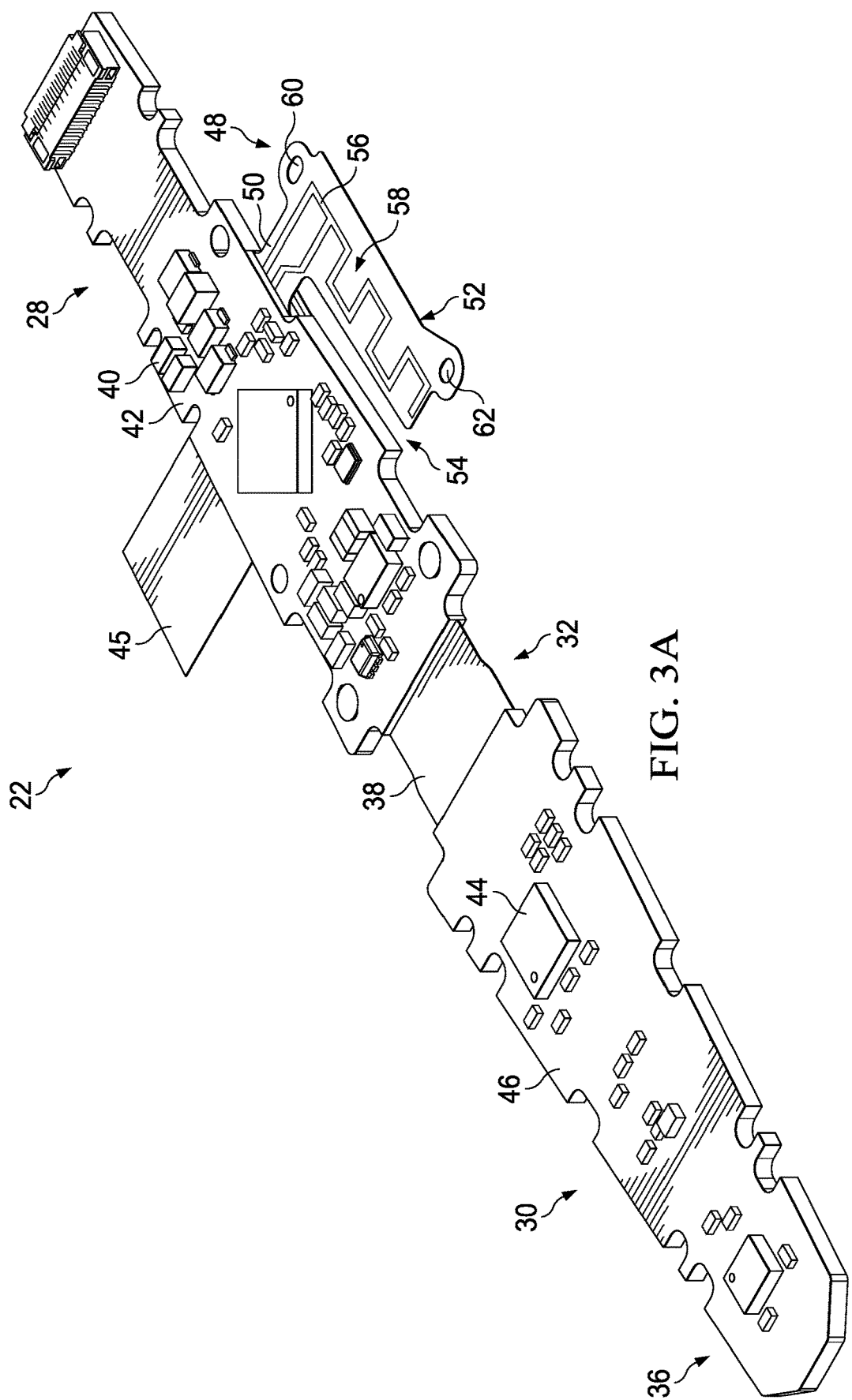
FIG. 3A is a perspective view of an electronic subassembly in a first position.
Figure 3B:
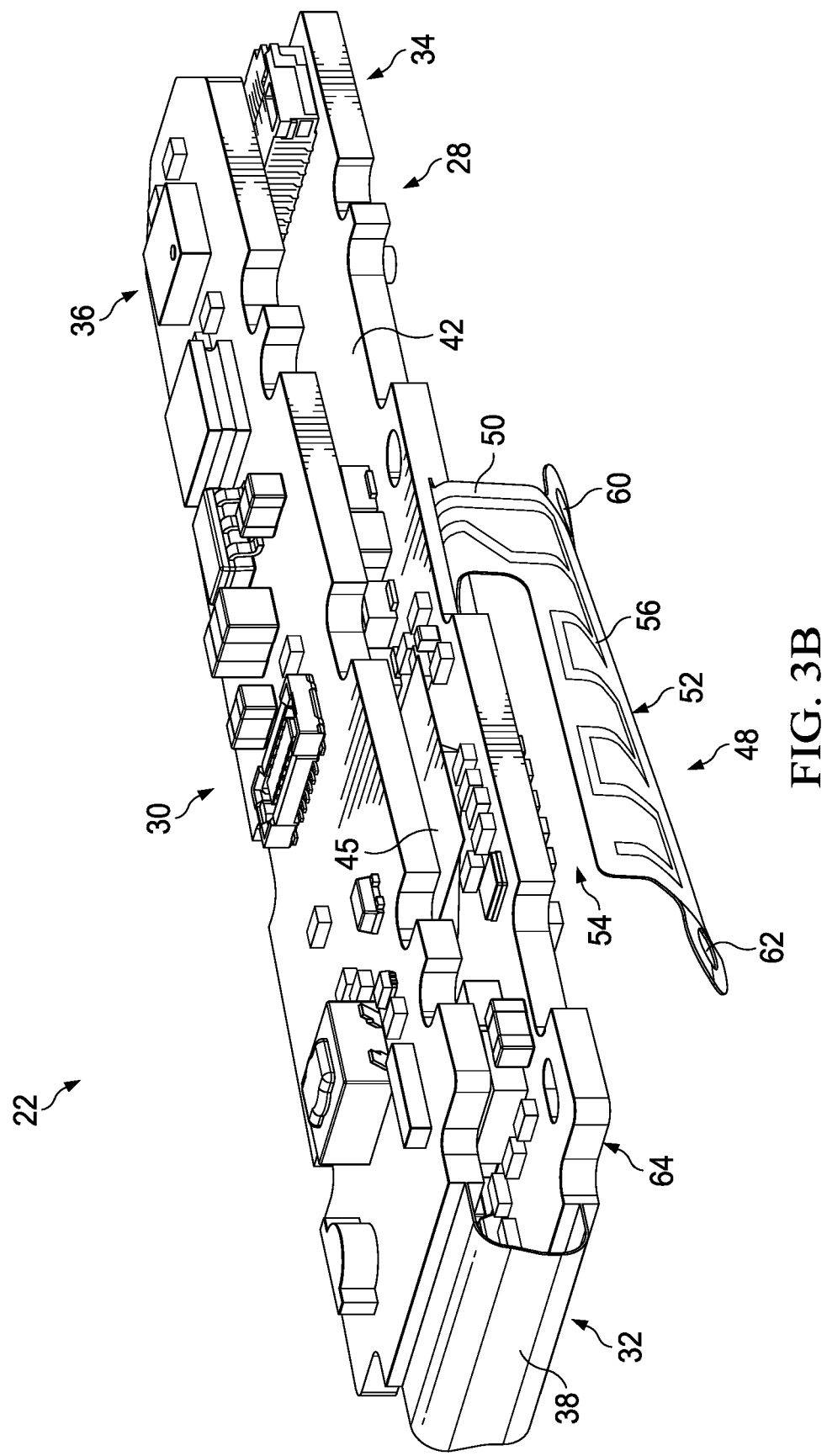
FIG. 3B is a perspective view of the electronic subassembly in a second position or the upright position.

Referring to FIGS. 3A and 3B a perspective view of the electronic subassembly 22 is illustrated in a first position and a second position, respectfully. The electronic subassembly 22 may include a flexible circuit board 32 (e.g., a flexible printed circuit board) having a first end portion 34 and a second end portion 36. The first rigid circuit board 28 may be mounted to the first end portion 34 of the flexible circuit board 32. The second rigid circuit board 30 may be mounted to the second end portion 36 of the flexible circuit board 32. It is understood that the electronic subassembly may be created by a laminating process in which multiple layers of flexible and/or rigid circuit boards may be stacked on top of each other creating stacked layers, like a sandwich. The first rigid circuit board 28 and the second rigid circuit board 30 may be secured and electrically connected to the flexible circuit board 32. The flexible circuit board 32 may have a flexible bridge 38 between the first end portion 34 and the second end portion 36. The flexible bridge 38 may be positioned between the first rigid circuit board 28 and the second rigid circuit board 30, thus allowing it to bend and fold over.

The first rigid circuit board 28 may have a plurality of electronic components 40 mounted to a top surface 42 of the first rigid circuit board 28, including, but not limited to capacitors, resistors, diodes, transistors and switches. It is understood that a bottom surface (not shown) of the first rigid circuit board 28 may also include a plurality of electronic components. One or more of the electronic components 40 may emit electromagnetic waves. The second rigid circuit board 30 may have a plurality of electronic components 44 mounted to a top surface 46 of the second rigid circuit board 30, including, but not limited to capacitors, resistors, diodes, transistors and switches. It is understood that a bottom surface (not shown) of the second rigid circuit board 30 may also include a plurality of electronic components. One or more of the electronic components 44 may emit electromagnetic waves. The electronic components 40 on the first rigid circuit board 28 may face the electronic components 44 on the second rigid circuit board 30 in the folded position.

In certain embodiments, the electronic subassembly 22 may include a flexible shield 45 adjacent the first rigid circuit board 28 and/or the second rigid circuit board 30. For example, the flexible shield 45 may extend outward from the first rigid circuit board 28. The flexible shield 45 may comprise copper or other material commonly used to block electromagnetic waves. In certain embodiments, the flexible shield 45 may not be electrically connected to any other components of the electronic sub assembly, such as the electronic components 40 and 44. The flexible shield 45 may be folded over the first rigid circuit board 28 and/or the second rigid circuit board 30 to cover the one or more electronic components 40 and 44. Accordingly, electromagnetic waves emitted from the one or more electronic components 40 and 44 may be effectively blocked by the flexible shield 45 so they do not cause interference with an antenna 52 that receives and/or transmits electromagnetic waves to external devices. After the flexible shield 45 is folded over the electronic component 40, the second rigid circuit board 30 may be folded over the first rigid circuit board 28 by bending the flexible circuit board 32 along the flexible bridge 38 so the top surface 42 of the first rigid circuit board 42 faces the top surface 46 of the second rigid circuit board 30. In certain embodiments, the flexible shield 45 may have a folded position in which the flexible shield is positioned between the first rigid circuit board 28 and the second rigid circuit board 30 (i.e., when second ridged circuit board 30 is folded over the first rigid circuit board 28). The flexible shield 45 may not be secured to the first rigid circuit board 28. For example, the flexible shield 45 may be held in place when the second rigid circuit board 30 is folded over the first rigid circuit board. Accordingly, the flexible shield 45 may touch between the first rigid circuit board 28 and/or the second rigid circuit board 30. It is understood that several electronic subassemblies 22 may be interconnect together by flexible bridges, thus allowing additional rigid circuit boards to be efficiently folded and stacked on top of each other.

In certain embodiments, the electronic subassembly 22 may include the flexible antenna 48 in electrical communication with the first rigid circuit board 28 and/or the second rigid circuit board 30. The flexible shield 45 and the flexible antenna 48 may be positioned on an opposite sides of the first rigid circuit board 28. However, the flexible shield 45 may be folded over the first rigid circuit board 28 and the flexible antenna 48 may be folded under the first rigid circuit board 28. The flexible antenna 48 may having a flexible bridge 50 extending from the flexible circuit board 32 and away from the first rigid circuit board 28. It is understood that the flexible antenna 48 may extend from any edge of the first rigid circuit board 28 and/or the second rigid circuit board 30. The flexible antenna 48 may include a flap 52 that is connected to the flexible circuit board 32 by the bridge 50. The flap 52 may be spaced apart from the first circuit board 28 by a gap 54 to facilitate the folding of the flexible antenna 48 (e.g., flap 52). The flap 52 may have a copper track 56 on a top surface 58 of the flexible antenna 48 (e.g., the flap 52) for sending and/or receiving electrical signals. As will be described in greater detail below, the a flexible antenna 48 may have one or more engagement surfaces to facilitate securing and holding the flexible antennae 48 in a folded position, as shown in FIG. 3B. For example, the flap 52 of the flexible antenna 48 may define one or more openings 60 and 62.

The flexible antenna 48, including the flap 52, may have a first position, as shown in FIG. 3A that is generally planar (e.g., generally on a same plane as the first rigid circuit board 28). The flexible antenna 48, including the flap 52 may have a second position, as shown in FIG. 3B, in which the flexible antenna 48 (e.g., flap 52) is folded away from the second circuit board 30 (e.g., under the first rigid circuit board 28). The flap 52 may be folded towards a bottom surface 64 of the first rigid circuit board 28. Accordingly, the copper track 56 may face away from the first rigid circuit board 28 and/or the second rigid circuit board 30. Accordingly, the second position may help shield the flexible antenna 48 from stray electromagnetic signals generated by the electronic components 40 and 44 of the first and second rigid circuit boards 28 and 30. The folding of the flexible antenna 48 also helps the electronic subassembly 22 fit within the handle 14 (FIG. 1) without being damaged during assembly.

Figure 4A:
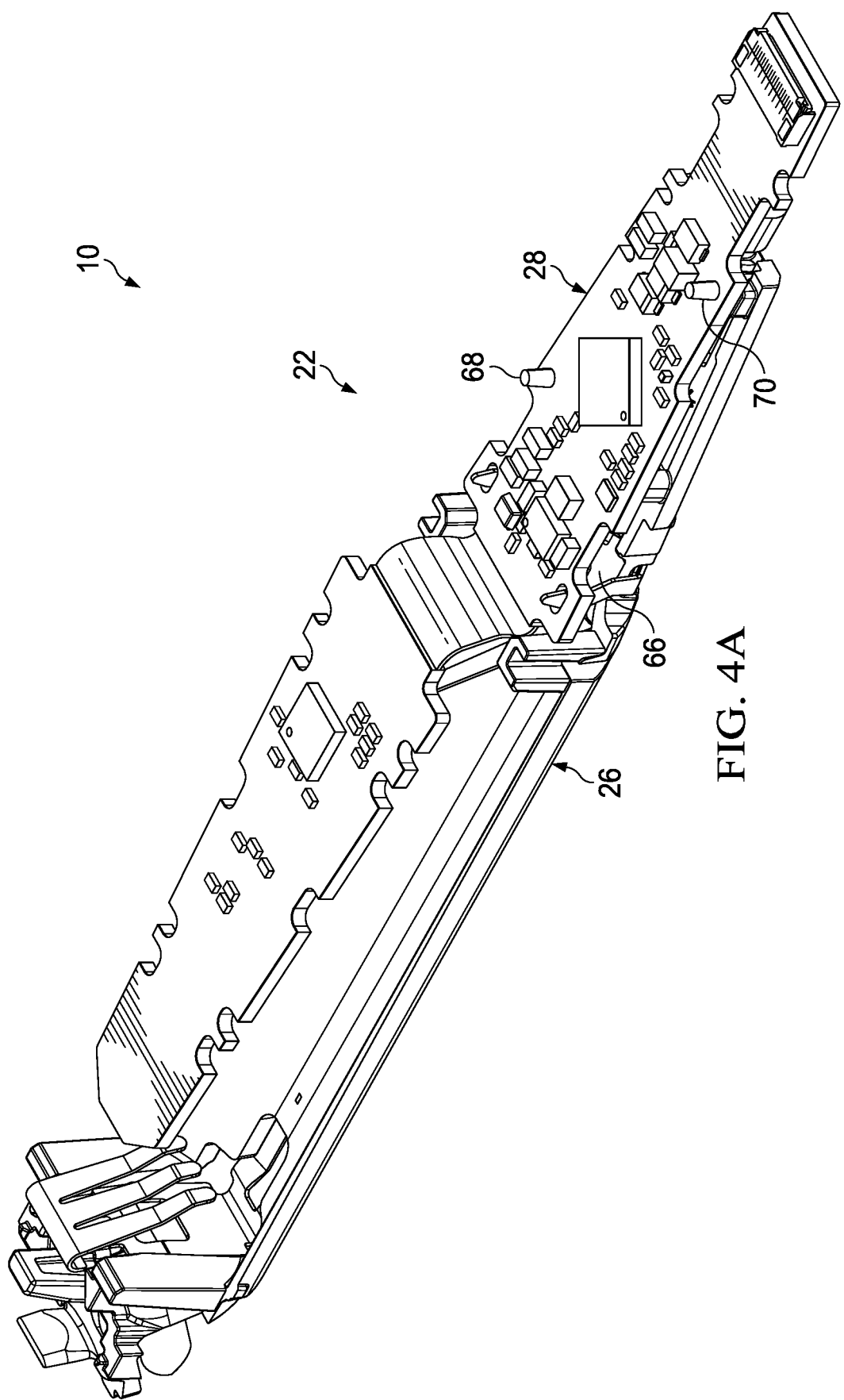
FIGS. 4A, 4B, 4C and 4D are perspective views of the personal care appliance of FIG. 1 at various stages of the assembly process.
Figure 4B:
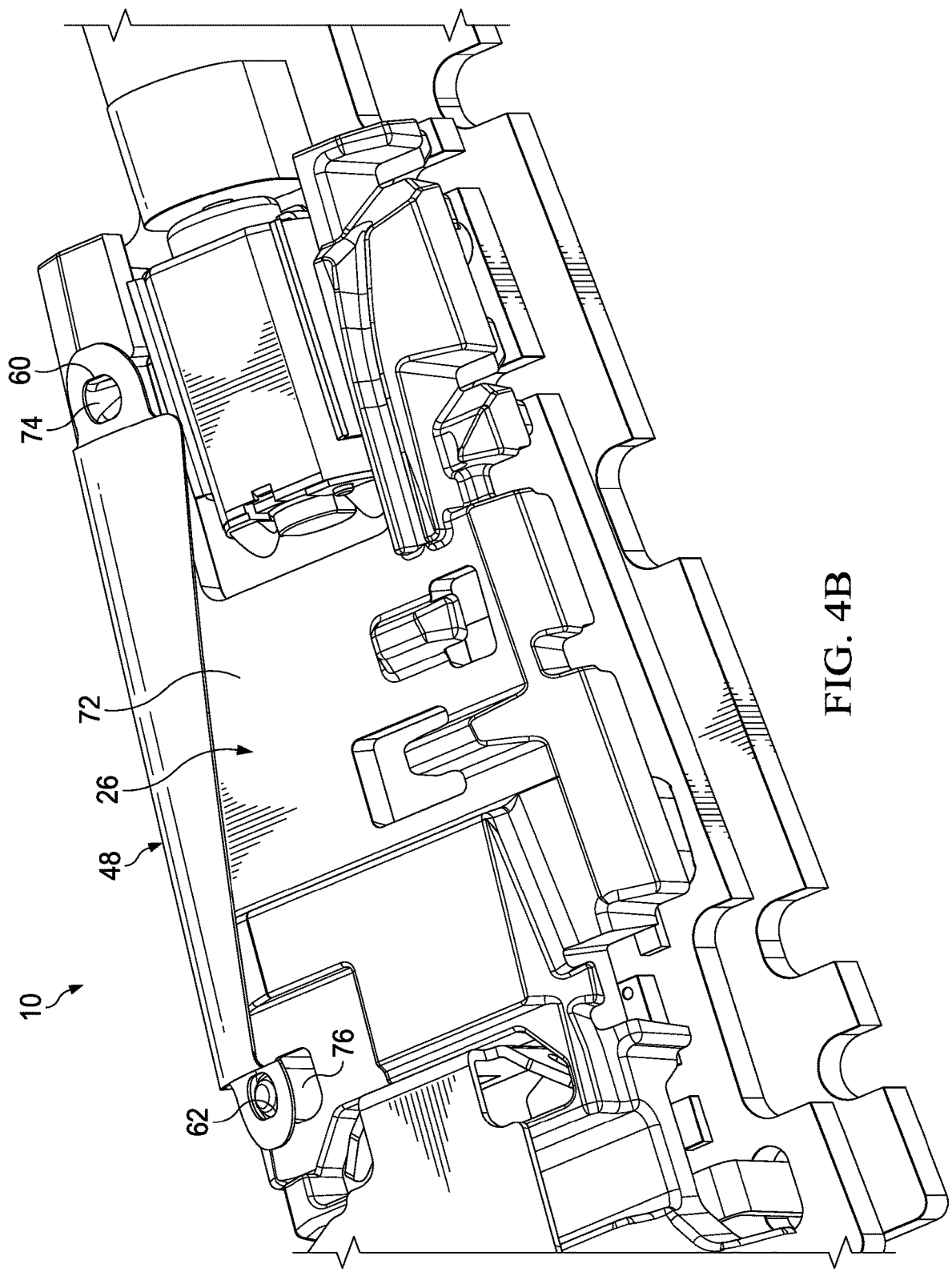
Figure 4C:
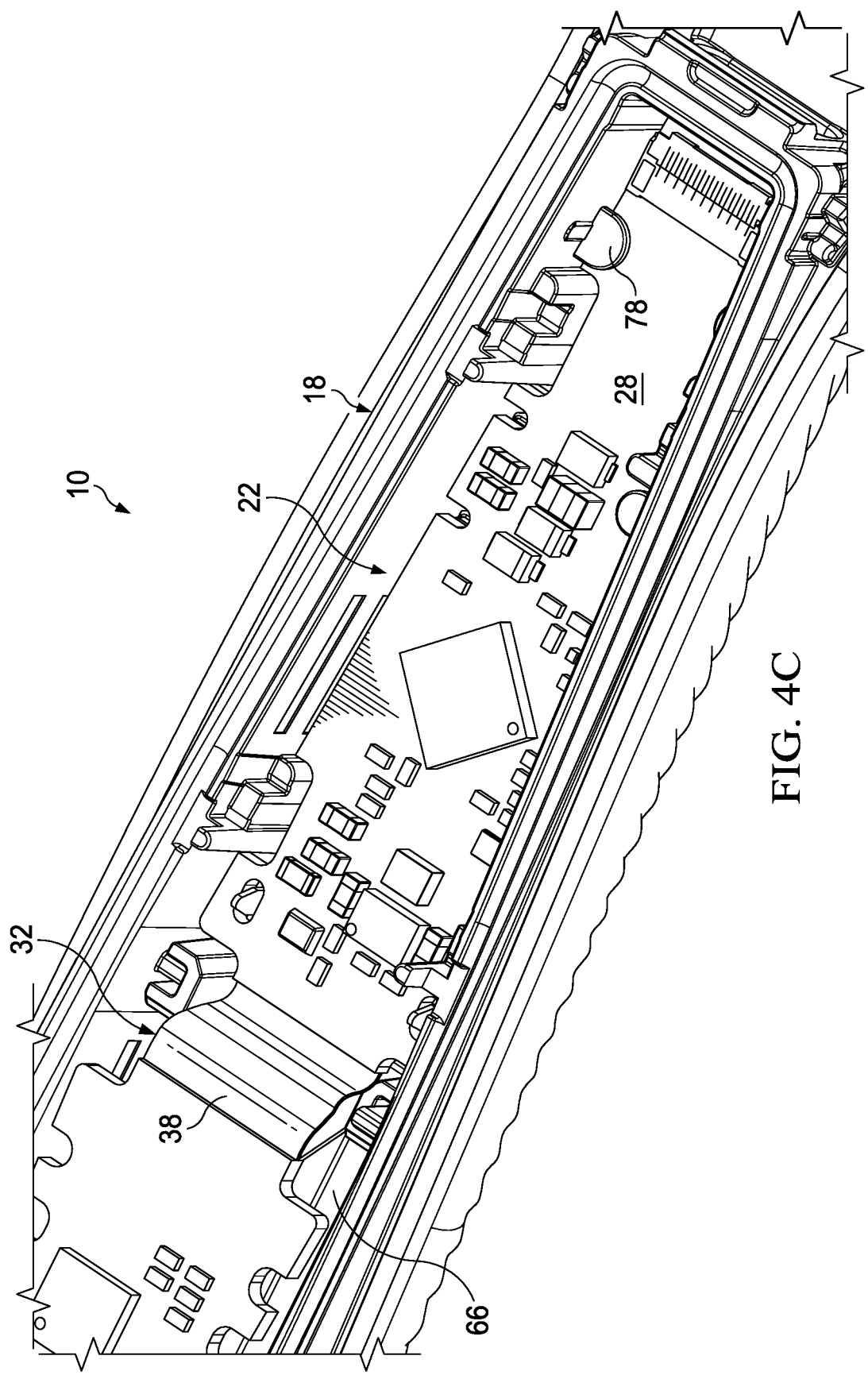
Figure 4D:
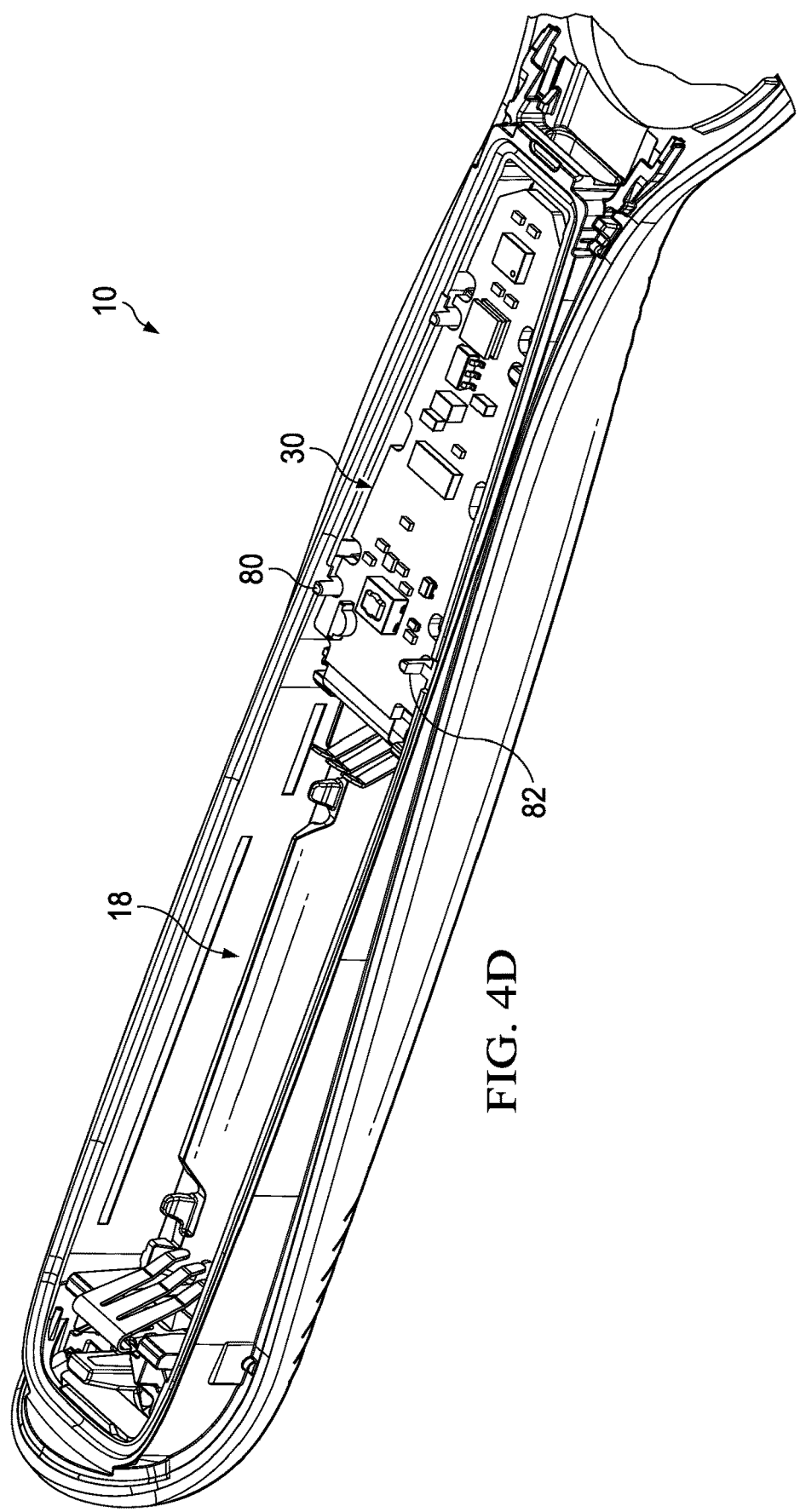

Referring to FIGS. 4A, 4B, 4C and 4D perspective views of the personal care appliance 10 is shown at various stages of the assembly process. In FIG. 4A, the electronic subassembly 22 is illustrated in the first position. The first rigid circuit board 28 may be mounted to a top surface 66 of the platform 26. The platform 26 may have one or more pegs 68 and 70 to properly position the first rigid circuit board 28. The first rigid circuit board 28 may be secured to the platform 26 by cold stamping the pegs 68 and 70. However, it is understood that other securing methods may be used, such as adhesives. The flexible antenna 48 may be folded over a portion of a lower surface 72 (opposite the top surface 66) of the platform 26, as shown in FIG. 4B. The openings 60 and 62 of the flexible antenna 48 may engage a corresponding tab 74 and 76 on the platform 26. The tabs 74 and 76 may facilitate quick and simple securement of the flexible antenna 48 in a folded position to the platform 26. The platform 26 with the electronic subassembly 22 (in the first position) may be positioned within the housing 18, as shown in FIG. 4C. For example, the first rigid circuit board, 28, the second rigid circuit board 30 and the flexible antenna 48 may be positioned within the housing 18. The first rigid circuit board 28 may be secured to the housing 18 by cold stamping one or more pegs 78 on the housing 18. The second rigid circuit board 30 may be folded over the first rigid circuit board 28, as shown in FIG. 4D. The first rigid circuit board 28 may be folded over the second rigid circuit board 30 by bending a portion (i.e., the flexible bridge 38) of the flexible circuit board 32 located between the first rigid circuit board 28 and the second rigid circuit board 30. The second rigid circuit board 30 may be secured to the housing 18 by cold stamping one or more pegs 80 and 82 of the housing 18. The first rigid circuit board 28 may be spaced apart from the second rigid circuit board 30 in the second position to prevent damage to the electronic subassembly 22. The cover 15 may be secured to the housing 18 to protect the electronic subassembly 22 from water ingress. The housing 18 may comprise a polymeric material such as polycarbonate or another non-metallic material to allow the flexible antenna 48 of FIG. 4B to send and receive signals. Accordingly, after assembling the electronic subassembly 22 to the housing 18, the electrical tracks 56 (FIG. 3B) of the flexible antenna 48 may face the housing 18.

Figure 5:
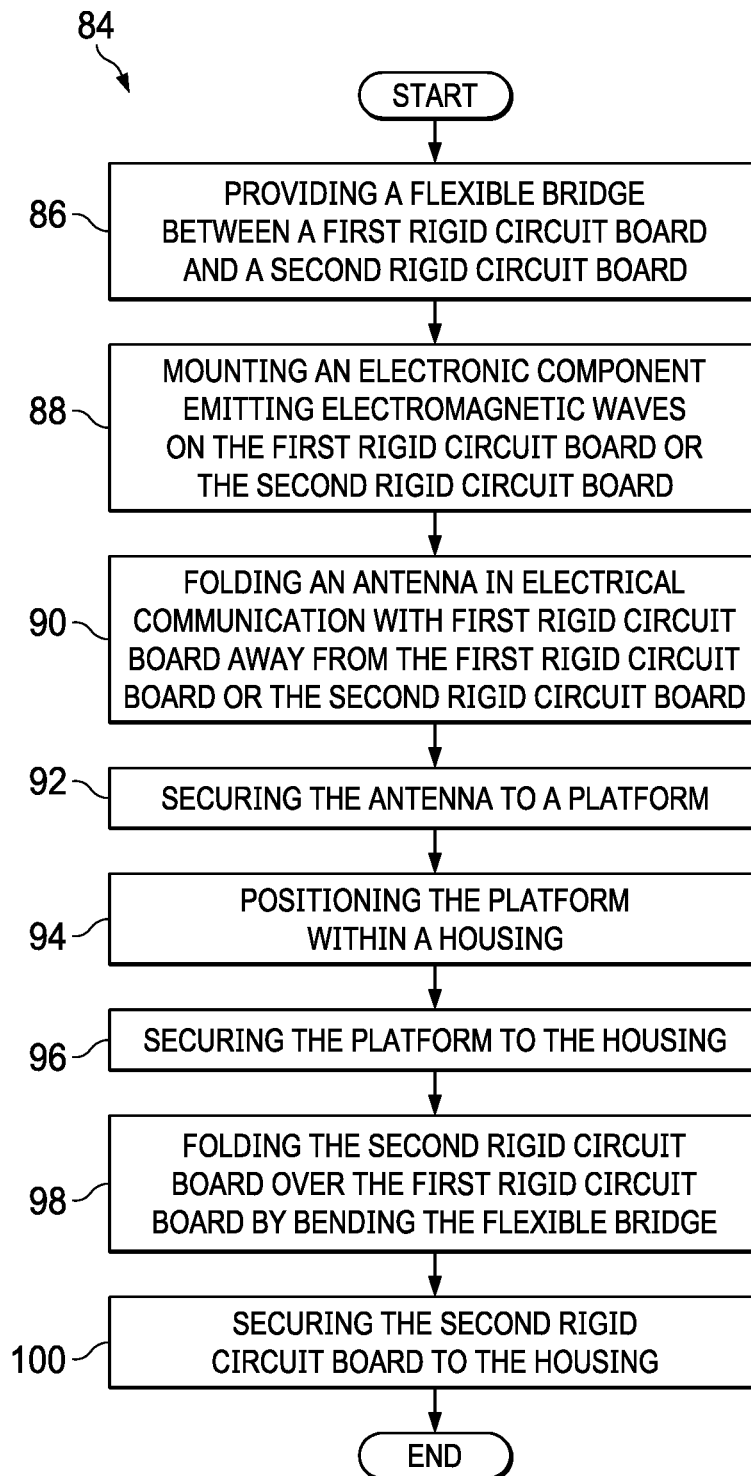
FIG. 5 is a block diagram that depicts a method of assembling the personal care appliance of FIG. 1 according to one or more embodiments shown and described herein.

FIG. 5 is a block diagram that depicts a method of assembling the personal care appliance 10 of FIG. 1 according to one or more embodiments shown and described herein. With reference to FIG. 5, a method 84 assembling a personal care appliance includes providing a flexible bridge between a first rigid circuit board and a second rigid circuit board at Step 86. An electronic component emitting electromagnetic waves may be mounted on the first rigid circuit board or the second rigid circuit board 88 at step 88. At step 90 an antenna in electrical communication with first rigid circuit board is folded away from the first rigid circuit board or the second rigid circuit board. At step 92, the antenna may be optionally secured to the platform. The platform may then be positioned within housing (step 94) and secured to the housing (step 96). At step 98, the first rigid circuit board may be folded over the second rigid circuit board by bending the flexible bridge. The second rigid circuit board may be secured to the housing, as provided in step 100.

Figure 6:
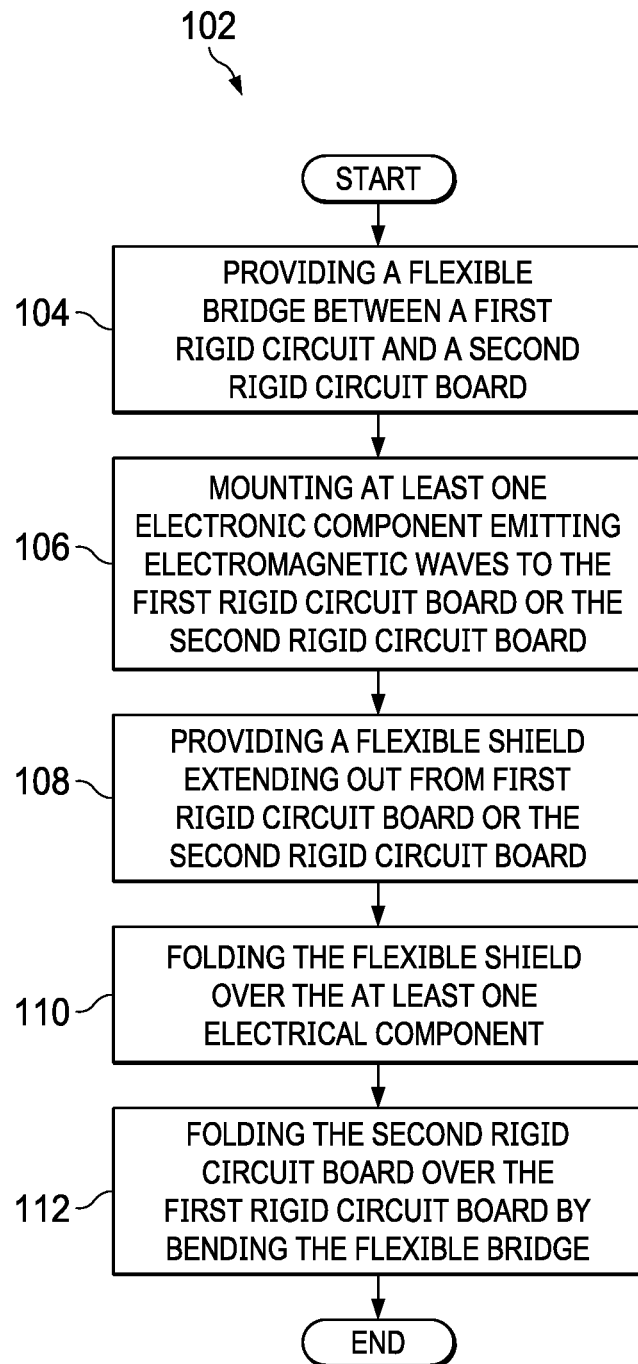
FIG. 6 is a block diagram that depicts another method of assembling an electronic subassembly according to one or more embodiments shown and described herein.

FIG. 6 is a block diagram that depicts a method of assembling an electronic subassembly according to one or more embodiments shown and described herein. With reference to FIG. 6, a method 102 of assembling an electronic subassembly by providing a flexible bridge between a first rigid circuit and a second rigid circuit board at step 104. An electronic component emitting electromagnetic waves is mounted to the first rigid circuit board or the second rigid circuit board at step 106. At step 108, a flexible shield extending out from first rigid circuit board or the second rigid circuit board is provided. The flexible shield may be folded over the at least one electronic component at step 110. At step 112, the second rigid circuit board may be folded over the first rigid circuit board by bending the flexible bridge located between the first and the second rigid circuit boards.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm" Furthermore, dimensions should not be held to an impossibly high standard of metaphysical identity that does not allow for discrepancies due to typical manufacturing tolerances. Therefore, the term "about" should be interpreted as being within typical manufacturing tolerances.

Every document cited herein, including any cross referenced or related patent or application is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A personal care appliance when in an upright position comprising:
    a flexible circuit board having a first end portion, a second end portion and a flexible bridge between the first end portion and the second end portion;
    a first rigid circuit board mounted to the first end portion of the flexible circuit board;
    a plurality of electronic components mounted to a top surface of the first rigid circuit board;
    a second rigid circuit board mounted to the second end portion of the flexible circuit board;
    a plurality of electronic components mounted to a top surface of the second rigid circuit board, the top surface of the first rigid circuit board faces the top surface of the second rigid circuit board;
    a flexible antenna positioned on the first rigid circuit board and in electrical communication with first rigid circuit board, the flexible antenna having a top surface with a copper track facing away from the first rigid circuit board and the flexible antenna is folded under the first rigid circuit board, wherein the flexible antenna comprises a flexible bridge extending from the flexible circuit board to a flap of the flexible antenna and the flap is secured to a platform that supports the first rigid circuit board.

2. A personal care appliance of claim 1 further comprising a housing defining a chamber and the first rigid circuit board, the second rigid circuit board and the flexible antenna are secured within the chamber.

3. The personal care appliance of claim 2 wherein the copper track faces way from the first rigid circuit board and towards the housing.

4. The personal care appliance of claim 3 wherein the housing comprises a non-metallic material.

5. The personal care appliance of claim 2 wherein the second rigid circuit board is secured to the housing.

6. The personal care appliance of claim 1 wherein the flap is spaced apart from the first rigid circuit board by a gap.

7. The personal care appliance of claim 1 wherein the flap has one or more openings secured to a corresponding tab on the platform.

8. The personal care appliance of claim 1 wherein the first rigid circuit board is positioned between the second rigid circuit board and the flexible antenna.

* * * * *